(12) United States Patent
Bechtel et al.

(10) Patent No.: US 8,957,439 B2
(45) Date of Patent: Feb. 17, 2015

(54) LED ASSEMBLY

(75) Inventors: Hans-Helmut Bechtel, Roetgen (DE);
Matthias Heidemann, Aachen (DE);
Peter J. Schmidt, Aachen (DE);
Thomas Diederich, Stolberg (DE)

(73) Assignee: Koninklijke Philips Electronics N.V.,
Eindhoven (NL)

( * ) Notice: Subject to any disclaimer, the term of this patent is extended or adjusted under 35 U.S.C. 154(b) by 448 days.

(21) Appl. No.: 13/131,384

(22) PCT Filed: Nov. 27, 2009

(86) PCT No.: PCT/IB2009/055380
§ 371 (c)(1),
(2), (4) Date: May 26, 2011

(87) PCT Pub. No.: WO2010/064177
PCT Pub. Date: Jun. 10, 2010

(65) Prior Publication Data
US 2011/0220953 A1 Sep. 15, 2011

(30) Foreign Application Priority Data
Dec. 2, 2008 (EP) .................................... 08170458

(51) Int. Cl.
*H01L 33/00* (2010.01)
*H01L 33/50* (2010.01)
*H01L 33/46* (2010.01)

(52) U.S. Cl.
CPC ............... *H01L 33/50* (2013.01); *H01L 33/46* (2013.01)

USPC ................................ 257/98; 257/99; 257/100

(58) Field of Classification Search
USPC ...................................................... 257/98–100
See application file for complete search history.

(56) References Cited

U.S. PATENT DOCUMENTS

| 5,813,753 | A | * | 9/1998 | Vriens et al. ................. 362/293 |
| 6,744,077 | B2 | * | 6/2004 | Trottier et al. ............... 257/103 |
| 7,378,792 | B2 | * | 5/2008 | Huang et al. ................. 313/512 |
| 2006/0208268 | A1 | | 9/2006 | Ueno |
| 2007/0267646 | A1 | | 11/2007 | Wierer et al. |
| 2008/0054803 | A1 | | 3/2008 | Zheng et al. |

FOREIGN PATENT DOCUMENTS

| DE | 102005062514 A1 | 3/2007 |
| EP | 0272760 A1 | 6/1988 |
| EP | 2149163 A1 | 2/2010 |
| JP | 2006261540 | 9/2006 |
| WO | 2007036214 A1 | 4/2007 |
| WO | 2008040298 A1 | 4/2008 |
| WO | 2008145096 A1 | 12/2008 |

* cited by examiner

*Primary Examiner* — Samuel Gebremariam

(57) ABSTRACT

A light emission diode (LED) assembly, comprising a LED die (10), a phosphor layer (12), and a filter layer (14), wherein said filter layer (14) is developed in such a manner that light rays with a wavelength of about 400 nm to 500 nm, preferably of about 420 nm to 490 nm, emitted from the LED die (10) are at least partially reflected depending on their emission angle to the normal on the filter layer (14). With the inventive LED assembly it is possible to provide a LED assembly which solves the yellow ring problem without a reduction of the efficiency of the LED assembly.

20 Claims, 2 Drawing Sheets

LED ASSEMBLY

FIELD OF THE INVENTION

The invention relates to the field of light emission diode (LED) assemblies. Particularly the invention relates to enhanced emission phosphor-converting LED light assemblies (pcLED). Such assemblies are often employed to provide white light.

BACKGROUND OF THE INVENTION

White light emitting LEDs generally comprise a blue emitting LED combined with a phosphor layer that is stimulated by the blue emission of the LED into emitting yellow light, the combination of the yellow and blue emissions providing a white light. For normal direction, vertical to the surface of the LED die or vertical to the surface of the phosphor layer with an emission angle of 0°, the path length in the phosphor layer of the light rays emitted by the blue emitting LED is equal to the thickness of the phosphor layer. For increasing emission angles the path length for blue light rays increases. Accordingly the fraction of absorbed blue light rays by the phosphor layer is lower for the light rays with an emission angle of 0° than for the light rays with an increasing emission angle. Since the converted light emitted by the phosphor layer always has a Lambertian over angle distribution, the white light emitted by the LED has a higher correlated colour temperature for normal emission with an emission angle of about 0°. Generally, the phosphor layer is a $Y_3Al_5O_{12}:Ce^{3+}$ (YAG: Ce). In case of such a YAG:Ce phosphor layer emitted light becomes yellowish with increasing emission angle, perceived as yellow ring. To solve the yellow ring problem it is known to increase the scattering power of the phosphor layer and/or to add a scattering layer on top of the phosphor layer. For both, the reduction of the yellow ring problem results in a reduction of the LED efficiency, since scattering is accompanied by light reflection leading to light losses. In particular, scattering of the down-converted phosphor emission leads to reflection with accompanied reflection losses.

SUMMARY OF THE INVENTION

Its is an object of the invention to provide a light emission diode (LED) assembly which solves the above stated yellow ring problem without a reduction of the efficiency of the LED assembly.

The light emission diode (LED) assembly according to the invention comprises a LED die, a phosphor layer, and a filter layer, wherein said filter layer is developed in such a manner that light rays with a wavelength of about 400 nm to 500 nm, preferably of about 420 nm to 490 nm, emitted from the LED die are at least partially reflected depending on their emission angle to the normal on the filter layer.

The LED die is preferably a blue emitting LED. The phosphor layer is preferably $Y_3Al_5O_{12}:Ce^{3+}$ (YAG:Ce). The filter layer is preferably a dielectric filter layer. This filter layer realises a full transmission for light rays emitted by the LED die independently from their wavelength within the visible range for large emission angles, preferably emission angle between 30° to 90°, to the normal of the filter. For smaller emission angles, preferably emission angles between 0° to 30° to the normal on the filter layer, partial reflections of the light rays with a wavelength of about 400 nm to 500 nm are provided. Light rays with a wavelength of about 400 nm to 500 nm are blue light rays emitted by the LED die. The partial reflections of the blue light rays emitted by the LED die depending on their emission angle to the normal on the filter layer realizes a uniform over angle emission without loss of efficiency of the light emitted by LED. The normal on the filter layer is along the axis vertical to the plain surface of the filter layer.

For uniform white light emitted by the LED die the emitted intensity ratio of directly emitted light from the LED die and converted light from the phosphor layer has to be constant under all angles. Usually light emitted by the LED provides a cudgel-shaped form in the area of small emission angle, preferably an emission angle of about 0° to 30° to the normal on the filter layer. However, the yellow light emitted by the LED die usually provides a ball-shaped form over the whole emission angle of about 0° to 90°. Thus, there are areas, especially at larger emission angles, preferably between 30° to 90° where the ratio of blue light to yellow light decreases. Emissions under these angles cause the yellow ring problem. By reflection of a certain amount of the blue light for small emission angles of about 0° to 30° it is possible to transform the cudgel-shaped form of the blue light into a ball-shaped form so that the blue light and the yellow light have the same ratio over the whole emission angle from 0° to 90°. Thus, a superposition of yellow light and blue light over the whole emission angle is obtained so that uniform white light is emitted by the LED assembly over the whole emission angle without a yellow ring problem.

Preferably, the filter layer reflects the light rays with an emission angle of about 0° to 30°, preferably of about 0° to 20°, to the normal on the filter layer. The reflected light rays are blue light rays of the emitted light of the LED die with a wavelength of about 400 nm to 500 nm, preferably of about 420 nm to 490 nm.

In a preferred embodiment of the invention about 10% to 50%, preferably of about 15% to 30%, of the light rays emitted by the LED die are reflected by the filter layer depending on their emission angle. The reflected light rays are blue light rays of the emitted light of the LED die with a wavelength of about 400 nm to 500 nm, preferably of about 420 nm to 490 nm. Thus, about 10% to 50%, preferably 15% to 40%, of the blue light rays emitted by the LED with an emission angle of about 0° to 40°, preferably of about 0° to 30°, to the normal on the filter layer are reflected. The rest of the blue light rays emitted by the LED with an emission angle of about 0° to 40°, preferably of about 0° to 30°, pass the filter layer without a reflection.

The filter layer comprises preferably a dielectric layer coating of alternating low and high refractive index materials. The alternating low and high refractive index materials may be chosen in such a manner that a well directed reflection of the blue light emitted by the LED die can be achieved.

The materials of the dielectric coating layer are preferably transparent for wavelength between 400 nm and 800 nm with a refractive index of the high refractive index materials in the range of 1.6 to 3 and with a refractive index of the low refractive index materials in the range of 1.2 to 1.8. The absorption coefficient of the index materials is <0.00001 for wavelength>480 nm and <0.003 for wavelength>400 nm. $Nb_2O_5$ (nobium oxide) is preferably used as high refractive index material and $SiO_2$ (silicon oxide) is preferably used as low refractive index material.

Preferably, the filter layer comprises nine layers of the high refractive index materials and nine layers of the low refractive index materials. The layers may be applied by thin film deposition techniques like chemical vapour deposition or sputtering.

According to a preferred embodiment of the invention, the filter layer is arranged between the LED die and the phosphor layer. Thus, the filter layer is positioned on top of the LED die and the phosphor layer is positioned on top of the filter layer.

Due to another embodiment of the invention, the phosphor layer is arranged on top of the LED die and the filter layer is arranged on top of the phosphor layer.

Additionally, it is possible according to a further embodiment of the invention, to provide a LED assembly with a first phosphor layer and a second phosphor layer, wherein the filter layer is arranged between the first phosphor layer and the second phosphor layer. Preferably, the first phosphor layer is positioned on top of the LED die.

The phosphor layer may comprise a Lumiramic plate and/or phosphor powder embedded in a transparent matrix material. The Lumiramic plate is a poly-crystalline ceramic plate of Ce (III) doped yttrium gadolinium garnet (Y, GdAG:Ce). To combine such a Lumiramic plate with a blue light emitting LED die to produce white light in the range of 5000 K correlated color temperature is very advantageously. Scattering and light extraction means of the Lumiramic ceramic color converter plates enable production of reliable and efficient white pcLEDs. Measurement of the optical properties of the Lumiramic plates before the final LED assembly allows pick and place packaging with exact targeting of the desired white color point of the LED.

Preferably, the LED assembly may provide a transparent glass plate which functions as a substrate for the filter layer. Thus, the filter layer does not have to be applied directly on the LED die or the phosphor layer. The filter layer can be easily applied to the transparent glass plate and after applying the filter layer on the glass plate it is arranged to the LED assembly.

According to a preferred embodiment of the invention, the filter layer has a total thickness of 750 nm to 950 nm, preferably of about 800 nm to 900 nm.

Further, according to an embodiment of the invention, the phosphor layer has a thickness of about 80 μm to 150 μm, preferably of about 100 μm to 130 μm.

Moreover, the layers of high refractive index materials preferably vary in thickness from 5 nm to about 70 nm and the layers of low refractive index materials preferably vary in thickness from about 20 nm to about 300 nm.

BRIEF DESCRIPTION OF THE DRAWINGS

These and other aspects of the invention will be apparent from and elucidated with reference to the embodiments described hereinafter.

In the drawings.

DETAILED DESCRIPTION OF THE EMBODIMENTS

Figure 1:
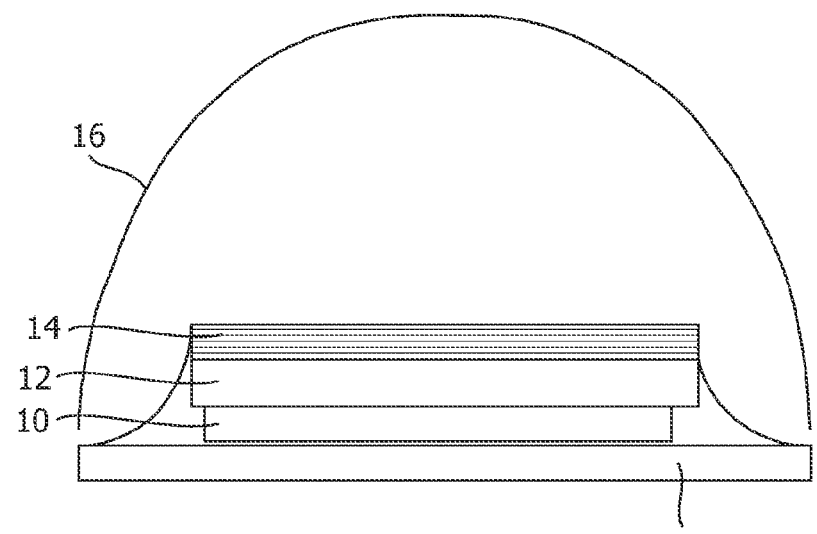
FIG. 1 is a schematic view of a first embodiment of a light emitting diode assembly according to the invention.

FIG. 1 shows a first embodiment of a light emission diode (LED) assembly according to the invention with a LED die 10, a phosphor layer 12 and a filter layer 14. The led die 10, the phosphor layer 12 and the filter 14 are preferably covered by a semicircle-shaped housing 16 that can have a reflecting coating applied to the interior wall thereof. The LED die 10 that emits blue light with a wavelength of about 400 nm to 500 nm is positioned at the bottom 18 of the LED assembly. On the top of the LED die 10 the phosphor layer 12 is positioned. The phosphor layer 12 emits yellow light with a wavelength of about 570 nm to 590 nm. The phosphor layer 12 may comprise a Lumiramic plate and/or a phosphor powder embedded in a transparent matrix material. The thickness of the phosphor layer 12 is about 100 μm to 120 μm. On the top of the phosphor layer 12 the filter layer 14 is positioned. The filter layer 12 comprises a dielectric layer coating of alternating low and high reflective index materials, like $Nb_2O_5$ and $SiO_2$.

Figure 2:
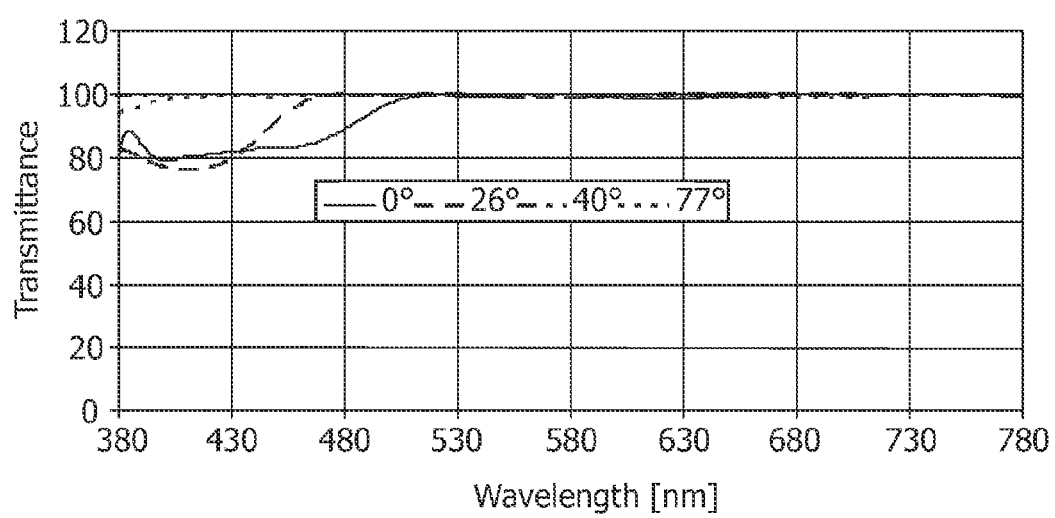
FIG. 2 is a graph showing the transmittance of the inventive filter layer depending on the emission angle and the wavelength of the light emitted by the LED die.

FIG. 2 shows a graph showing the transmittance of the inventive filter layer 14 depending on the emission angle and the wavelength of the light emitted by the LED die 10. The filter layer 14 shown in this graph has a layer construction shown in the following table 1:

TABLE 1

| Layer | Material | Thickness [nm] |
|---|---|---|
| 1 | $Nb_2O_5$ | 15.04 |
| 2 | $SiO_2$ | 40.81 |
| 3 | $Nb_2O_5$ | 19.95 |
| 4 | $SiO_2$ | 62.79 |
| 5 | $Nb_2O_5$ | 11.03 |
| 6 | $SiO_2$ | 554.43 |
| 7 | $Nb_2O_5$ | 1.32 |
| 8 | $SiO_2$ | 101.21 |
| 9 | $Nb_2O_5$ | 13.57 |
| 10 | $SiO_2$ | 76.41 |
| 11 | $Nb_2O_5$ | 19.62 |
| 12 | $SiO_2$ | 58.04 |
| 13 | $Nb_2O_5$ | 15.14 |
| 14 | $SiO_2$ | 72.37 |
| 15 | $Nb_2O_5$ | 15.13 |
| 16 | $SiO_2$ | 97.54 |
| 17 | $Nb_2O_5$ | 12.78 |
| 18 | $SiO_2$ | 90.31 |
| 19 | $Nb_2O_5$ | 7.44 |
| 20 | $SiO_2$ | 66.31 |
| 21 | $Nb_2O_5$ | 3.68 |

The different lines shown in the graph are the different emission angles 0°, 26°; 40° and 77°. As it can be seen, for large emission angles, like 40° and 77°, light rays independent from its wavelength are able to pass the filter layer 14 without any reflection or absorption. At this emission angle the transmission of the emitted light rays, especially the blue emitted light rays, is about 100%. For small emission angles, like 0° and 26°, blue light rays with a wavelength of 400 nm to 500 nm are not completely able to pass the filter layer. At this emission angle the transmission of the emitted light rays is about 80%. About 20% of the blue light rays are reflected by the filter layer 14. The yellow light rays of the phosphor layer 12 with a wavelength of about 520 nm to 650 nm are fully able to pass the filter layer independent from the emission angle. Thus, the filter layer 14 only reflects some of the blue emitted light rays. The partial reflections of blue light rays emitted by the LED die 10 depending on their emission angle to the normal on the filter layer 14 realizes a uniform over angle emission without loss of efficiency of the light emitted by the LED die 10, because blue light reflected at the filter layer is absorbed by the phosphor layer and converted to phosphor emission.

The filter layer 14 can also have the layer construction shown in the following table 2:

TABLE 2

| Layer | Material | Thickness [nm] |
|---|---|---|
| 1 | $Nb_2O_5$ | 25.85 |
| 2 | $SiO_2$ | 33.7 |
| 3 | $Nb_2O_5$ | 29.11 |
| 4 | $SiO_2$ | 36.26 |
| 5 | $Nb_2O_5$ | 11.19 |
| 6 | $SiO_2$ | 35.9 |
| 7 | $Nb_2O_5$ | 11.91 |
| 8 | $SiO_2$ | 95.52 |
| 9 | $Nb_2O_5$ | 14.5 |
| 10 | $SiO_2$ | 114.43 |
| 11 | $Nb_2O_5$ | 22.39 |
| 12 | $SiO_2$ | 50.5 |
| 13 | $Nb_2O_5$ | 32.33 |
| 14 | $SiO_2$ | 27.98 |
| 15 | $Nb_2O_5$ | 31.87 |
| 16 | $SiO_2$ | 68.13 |
| 17 | $Nb_2O_5$ | 12.63 |
| 18 | $SiO_2$ | 203.49 |

Figure 3:
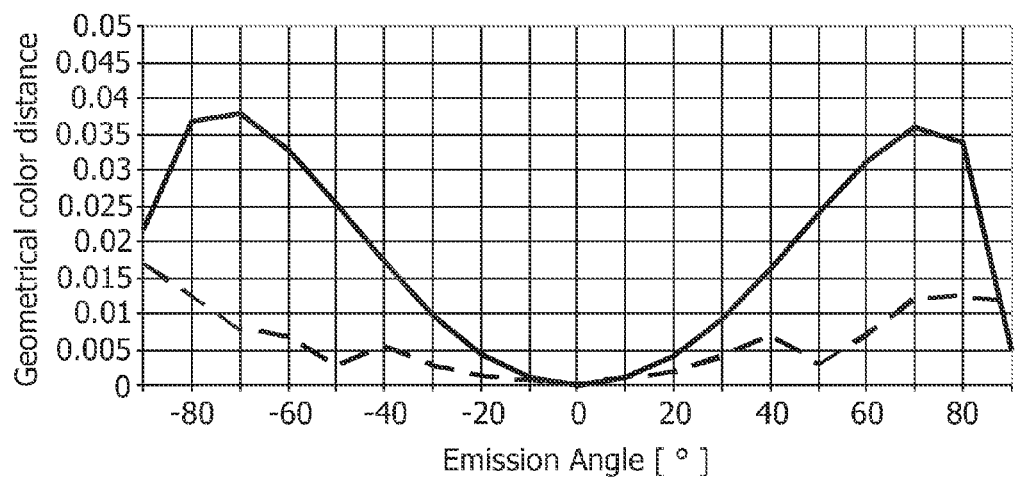
FIG. 3 is a graph showing geometrical distance of color coordinates to the color coordinates in normal emission in Uniform Color Space (CIE 1976) of a white LED assembly.

FIG. 3 shows the geometrical distance of color coordinates to the color coordinates in normal emission in Uniform Color Space (CIE 1976) of a white LED assembly without (full line) and with (dashed line) an inventive filter layer depending from the emission angle of the emitted light rays. As it can be seen in the graph, with the inventive filter layer 14 it is possible to obtain an almost constant color of the light rays emitted of the LED assembly independent from the emission angle of the light rays.

Figure 4:
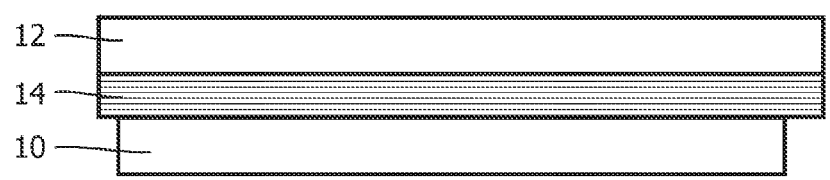
FIG. 4 is a schematic view of a second embodiment of a light emitting diode assembly according to the invention.

FIG. 4 shows a schematic view of a second embodiment of a light emitting diode assembly according to the invention. In this embodiment the filter layer 14 is arranged between the LED die 10 and the phosphor layer 12.

Figure 5:
FIG. 5 is a schematic view of a third embodiment of a light emitting diode assembly according to the invention.

FIG. 5 shows a schematic view of a third embodiment of a light emitting diode assembly according to the invention, whereas the LED assembly comprises a first phosphor layer 12 and a second phosphor layer 20. The filter layer 14 is arranged between the first phosphor layer 12 and the second phosphor layer 20, whereas the first phosphor layer 12 is positioned on top of the LED die 10.

While the invention has been illustrated and described in detail in the drawings and foregoing description, such illustration and description are to be considered illustrative or exemplary and not restrictive, the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An LED assembly, comprising:
a LED die,
a phosphor layer, and
a filter layer, wherein the filter layer is developed in such a manner that light rays with a wavelength of about 400 nm to 500 nm emitted from the LED die are at least partially reflected depending on their emission angle to normal on the filter layer, wherein light at an emission angle near the normal is reflected more than light at an emission angle far from the normal.

2. The LED assembly of claim 1, wherein the filter layer reflects the light rays with an emission angle of about 0° to 30° to the normal on the filter layer.

3. The LED assembly of claim 1, wherein about 10% to 50%, of the light rays emitted by the LED die are reflected depending on their emission angle to the normal on the filter.

4. The LED assembly of claim 1, wherein the filter layer comprises a dielectric layer coating of alternating low and high refractive index materials.

5. The LED assembly of claim 4, wherein the materials of the dielectric coating layer are transparent for wavelength between 400 nm to 800 nm with a refractive index of the high refractive index materials in the range of 1.6 to 3 and with a refractive index of the low refractive index materials in the range of 1.2 to 1.8.

6. The LED assembly of claim 4, wherein nine layers of the high refractive index materials and nine layers of the low refractive index materials are provided.

7. The LED assembly of claim 4, wherein the layers of the high refractive index materials vary in thickness from 5 nm to about 70 nm and the layers of low refractive index materials vary in thickness from about 20 nm to about 300 nm.

8. The LED assembly of claim 1, wherein the filter layer is arranged between the LED die and the phosphor layer.

9. The LED assembly of claim 1, wherein the phosphor layer is arranged on top of the LED die and the filter layer is arranged on top of the phosphor layer.

10. The LED assembly of claim 1, wherein the LED assembly comprises a first phosphor layer and a second phosphor layer, wherein the filter layer is arranged between the first phosphor layer and the second phosphor layer.

11. The LED assembly of claim 1, wherein the phosphor layer comprises a Lumiramic plate and/or a phosphor powder embedded in a transparent matrix material.

12. The LED assembly of claim 1, wherein a transparent glass plate is provided as a substrate for the filter layer.

13. The LED assembly of claim 1, wherein the filter layer has a total thickness of 750 nm to 950 nm.

14. The LED assembly of claim 1, wherein the phosphor layer has a thickness of about 80 μm to 150 μm.

15. An LED assembly, comprising
a LED die,
a phosphor layer, and
a filter layer,
wherein the filter layer is substantially more reflective of light rays with a wavelength of 420 nm to 490 nm than light rays with a wavelength above 500 nm when the light rays are substantially normal to a lateral surface of the filter layer, and the filter layer is substantially more reflective of light rays of 450 nm that are near the normal than light rays that are far from the normal.

16. The LED assembly of claim 15, wherein the filter layer is substantially more reflective of light rays of 450 nm that are within 0 to 30 degrees of the normal than light rays that are greater than 40 degrees off the normal.

17. The LED assembly of claim 15, wherein the filter layer reflects 10 to 30 percent of the light rays within 420 nm and 490 nm that are substantially normal to the surface.

18. The LED assembly of claim 15, wherein the filter layer includes a dielectric layer coating of alternating low and high refractive index materials.

19. The LED assembly of claim 15, wherein the filter layer is situated between the LED die and the phosphor layer.

20. The LED assembly of claim 15, wherein the phosphor layer is situated between the LED die and the filter layer.

* * * * *